(12) United States Patent
Yamamoto et al.

(10) Patent No.: US 9,674,970 B2
(45) Date of Patent: Jun. 6, 2017

(54) MODULE BOARD AND MANUFACTURING METHOD THEREOF

(71) Applicant: Murata Manufacturing Co., Ltd., Nagaokakyo-shi, Kyoto-fu (JP)

(72) Inventors: Issei Yamamoto, Nagaokakyo (JP); Akihiko Kamada, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 107 days.

(21) Appl. No.: 13/684,608

(22) Filed: Nov. 26, 2012

(65) Prior Publication Data
US 2013/0077262 A1 Mar. 28, 2013

Related U.S. Application Data

(63) Continuation of application No. PCT/JP2011/061807, filed on May 24, 2011.

(30) Foreign Application Priority Data

May 26, 2010 (JP) ................. 2010-120645

(51) Int. Cl.
H05K 1/14 (2006.01)
H05K 3/46 (2006.01)
(Continued)

(52) U.S. Cl.
CPC .......... H05K 3/4697 (2013.01); H05K 1/141 (2013.01); H05K 1/145 (2013.01); H05K 1/186 (2013.01);
(Continued)

(58) Field of Classification Search
CPC ................... H05K 3/46; H05K 1/14
(Continued)

(56) References Cited

U.S. PATENT DOCUMENTS 5,239,198 A * 8/1993 Lin et al. ............... 257/693
6,680,441 B2 * 1/2004 Kondo ............... H05K 1/186
174/252

(Continued)

FOREIGN PATENT DOCUMENTS

JP 2001-053411 A 2/2001
JP 2002-043754 A 2/2002
(Continued)

OTHER PUBLICATIONS

Official Communication issued in corresponding Japanese Patent Application No. 2012-517265, mailed on Sep. 18, 2013.
(Continued)

Primary Examiner — Jenny L Wagner
Assistant Examiner — Michael E Moats, Jr.
(74) Attorney, Agent, or Firm — Keating & Bennett, LLP

(57) ABSTRACT

In a method of manufacturing a module board, an electronic component is mounted on a first principal surface of a small board. A cavity defining a through hole is formed in a core board. The electronic component is housed in the cavity by mounting the small board on a surface electrode arranged around the cavity. Resin layers are formed on both principal surfaces of the core board, and resin flows through a gap between the core board and the small board. Hence, the inside of the cavity is filled with the resin, and the electronic component is sealed with the resin.

19 Claims, 7 Drawing Sheets

(51) Int. Cl.
    *H05K 1/18*       (2006.01)
    *H05K 3/28*       (2006.01)
(52) U.S. Cl.
    CPC ............... *H01L 2224/16225* (2013.01); *H01L 2924/19105* (2013.01); *H05K 1/182* (2013.01); *H05K 3/284* (2013.01); *H05K 3/4629* (2013.01); *H05K 2201/049* (2013.01); *H05K 2203/1316* (2013.01); *Y10T 29/49126* (2015.01)
(58) Field of Classification Search
    USPC ........................................................ 361/761
    See application file for complete search history.

(56) References Cited

U.S. PATENT DOCUMENTS

| 2004/0056344 | A1 | 3/2004 | Ogawa et al. |
| 2004/0201085 | A1 | 10/2004 | Ogawa et al. |
| 2004/0203260 | A1* | 10/2004 | Block et al. .................... 439/65 |
| 2007/0170582 | A1 | 7/2007 | Nomura et al. |
| 2010/0025082 | A1* | 2/2010 | Sasaoka ............... H05K 1/0206 174/252 |

FOREIGN PATENT DOCUMENTS

| JP | 2003-060353 A | 2/2003 |
| JP | 2003-158239 A | 5/2003 |
| JP | 2005-045284 A | 2/2005 |
| JP | 2005-504443 A | 2/2005 |
| JP | 2005-109307 A | 4/2005 |
| JP | 2006-310541 A | 11/2006 |
| WO | 2006/043474 A1 | 4/2006 |
| WO | 2007/072616 A1 | 6/2007 |
| WO | 2009/037833 A1 | 3/2009 |

OTHER PUBLICATIONS

Official Communication issued in International Patent Application No. PCT/JP2011/061807, mailed on Jun. 21, 2011.

* cited by examiner

MODULE BOARD AND MANUFACTURING METHOD THEREOF

BACKGROUND OF THE INVENTION

1. Field of the Invention

The present invention relates to a module board embedded with an electronic component.

2. Description of the Related Art

A module board disclosed in Japanese Unexamined Patent Application Publication No. 2002-43754 is configured as follows. First, a core board having a cavity is prepared. Also, a resin film having a circuit pattern formed on a first principal surface is prepared. An electronic component is mounted on the circuit pattern of the resin film. Then, the core board and the resin film are bonded by thermocompression bonding such that the electronic component is housed in the cavity. After thermocompression bonding, the resin film is hardened by thermosetting, then a via hole penetrating through the resin film is formed, and a circuit pattern is formed on a second principal surface of the resin film. The electronic component housed in the cavity is connected to the circuit pattern on the second principal surface of the resin film through the via hole.

The resin of the resin film is fluidized and moves during thermocompression bonding, and hence the position of the circuit pattern and the position of the electronic component may vary. If the positions of the circuit pattern and the electronic component vary, a connection failure may occur with respect to the via hole formed at a predetermined position. Hence, the circuit pattern on the resin film formed for mounting the electronic component had to be large. As a result, an electronic component having multiple terminals with small pitches between terminals could not be housed in the cavity. Also, the resin could not be supplied from the resin film by an amount sufficient for filling the cavity with the resin. When the cavity is filled with the resin, the resin had to be additionally supplied.

SUMMARY OF THE INVENTION

To address the above-described problems, a module board according to a preferred embodiment of the present invention includes a first board including an electronic component mounted on a first principal surface; and a second board including a hole arranged to house the electronic component. The first board is mounted on a first principal surface of the second board such that the electronic component is housed in the hole. Resin layers are provided on both the first principal surface and a second principal surface of the second board, and the inside of the hole is filled with resin.

With this module board, an electronic component including multiple terminals with small pitches between the terminals can be mounted on the board and housed in the cavity. Further, since the electronic component housed in the cavity is sealed with the resin that forms the resin layers, reliability can be increased.

Also, according to a preferred embodiment of the present invention, the electronic component housed in the hole may preferably protrude from the second principal surface of the second board.

In this case, an electronic component with a larger thickness than the thickness of the core board including the cavity can be housed in the cavity. Hence, the height of the module board can be decreased.

Also, according to a preferred embodiment of the present invention, the first board may preferably include a recess at the first principal surface, and the electronic component may be preferably mounted in the recess.

In this case, an electronic component with a larger thickness can be housed in the cavity.

Also, according to a preferred embodiment of the present invention, another electronic component may be preferably mounted on a second principal surface of the first board.

In this case, packaging density of the module board can be increased.

Also, according to a preferred embodiment of the present invention, another electronic component may be preferably embedded in the first board.

In this case, the height of the module board can be decreased while the packaging density of the module board is increased.

Also, according to a preferred embodiment of the present invention, the hole may be preferably covered with the first board.

In this case, an electronic component corresponding to the area of the cavity can be mounted on the first board.

Also, a manufacturing method of a module board according to another preferred embodiment of the present invention includes a step of preparing a first board including an electronic component mounted on a first principal surface; a step of preparing a second board including a hole arranged to house the electronic component; a mounting step of connecting a connection land on the first principal surface of the first board to a connection land around the hole at a first principal surface of the second board by a connection member, and mounting the first board on the first principal surface of the second board such that the electronic component is housed in the hole; and a resin-layer forming step of forming resin layers on both the first principal surface and a second principal surface of the second board, and filling the inside of the hole with resin.

With this manufacturing method of the module board, an electronic component including multiple terminals with small pitches between the terminals can be mounted on the board and housed in the cavity. Further, since the electronic component housed in the cavity is sealed with the resin, the reliability can be increased.

Also, a manufacturing method of a module board according to a further preferred embodiment of the present invention includes a step of preparing a first board including a connection land on a first principal surface; a step of preparing a second board including a through hole arranged to house an electronic component; a first mounting step of connecting the connection land on the first principal surface of the first board to a connection land around the hole at a first principal surface of the second board by a connection member, and mounting the first board on the first principal surface of the second board; a second mounting step of mounting the electronic component on the first principal surface of the first board, which is exposed through the through hole, from a side at the second principal surface of the second board; and a resin-layer forming step of forming resin layers on both the first principal surface and the second principal surface of the second board, and filling the inside of the through hole with resin.

With this manufacturing method of the module board, a module board in which an electronic component with a larger thickness is housed in the cavity and sealed with the resin can be manufactured.

With various preferred embodiments of the present invention, even an electronic component including multiple terminals can be housed in the cavity, and the inside of the cavity can be filled with the resin. As a result, reliability of the electronic component is significantly increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of module boards and manufacturing methods thereof according to the present invention are described with reference to the drawings.

First Preferred Embodiment

Figure 1:
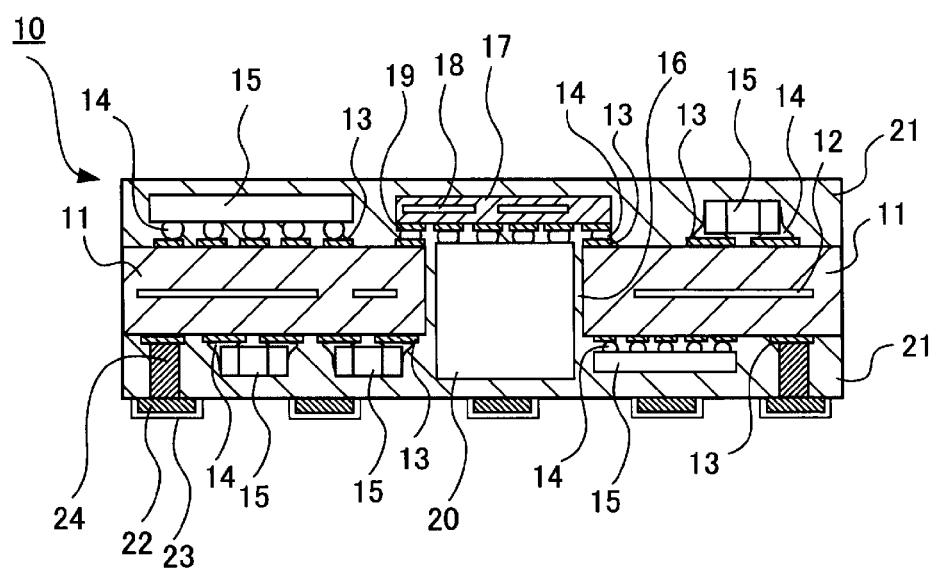
FIG. 1 is a cross-sectional view showing a module board according to a first preferred embodiment of the present invention.

FIG. 1 is a cross-sectional view of a module board 10 according to a first preferred embodiment of the present invention. A core board 11 is preferably configured of an LTCC (low temperature co-fired ceramics) board including ceramic green sheets stacked on each other. Inner wiring 12 is provided in the core board 11. Also, surface electrodes 13 are located on both principal surfaces of the core board 11. A cavity 16 is provided as a through hole penetrating through both the principal surfaces. Electronic components 15 are mounted on the surface electrodes 13 through solder 14.

A small board 17 includes inner wiring 18, and includes a surface electrode 19 on a first principal surface. An electronic component 20 is mounted on the surface electrode 19 on the first principal surface of the small board 17 through the solder 14. The small board 17 is mounted on the first principal surface of the core board 11 such that the electronic component 20 is housed in the cavity 16. In this case, the small board 17 is mounted on the surface electrode 13 around the cavity 16 of the core board 11 through the solder 14.

Resin layers 21 are made of resin and provided on both the principal surfaces of the core board 11. The inside of the cavity 16 is also filled with the resin. An outer electrode 22 is provided on the resin layer 21 located on the second principal surface of the core board 11. A plating film 23 is provided on the surface of the outer electrode 22. The outer electrode 22 is connected to the surface electrode 13 through a via 24 arranged to penetrate through the resin layer 21.

Figure 2A:
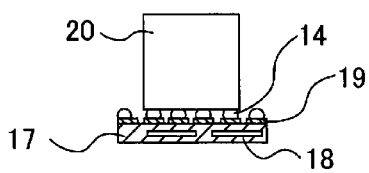
FIGS. 2A-2E are cross-sectional views each showing a manufacturing step of the module board according to the first preferred embodiment of the present invention.

A non-limiting example of a manufacturing method of the module board according to the first preferred embodiment is described next with reference to FIGS. 2A-2E. As shown in FIG. 2A, the small board 17 is prepared. The small board 17 includes the inner wiring 18 formed therein and the surface electrode 19 formed thereon. Then, the electronic component 20 is mounted on the surface electrode 19 of the small board 17 through the solder 14. The electronic component 20 preferably is a multi-terminal electronic component. The small board 17 may be a resin board or an LTCC board. With either of the boards, the electronic component 20 including multiple terminals with small pitches between the terminals can be mounted.

Figure 2B:
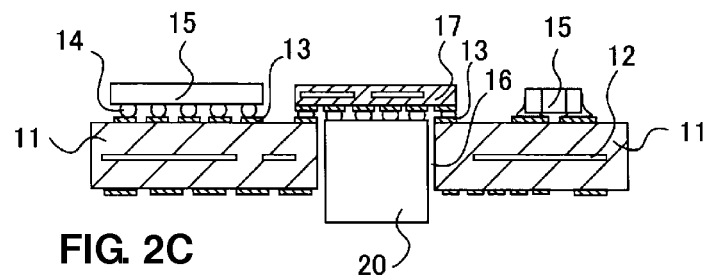

Then, as shown in FIG. 2B, the core board 11 is prepared. The core board 11 is an LTCC board including the cavity 16 formed as a through hole. The surface electrodes 13 are formed on both the principal surfaces of the core board 11. Also, the inner wiring 12 is formed in the core board 11.

Then, the solder 14, which becomes a connection member, is printed on the surface electrode 13 on the first principal surface of the core board 11, the electronic component 15 is mounted, and the small board 17 mounted with the electronic component 20 is mounted. In this case, the electronic component 20 is mounted at a center portion of the small board 17, and the surface electrode 19 for connection to the core board 11 is formed at an end portion of the small board 17. Also, the surface electrode 13 is formed around the cavity 16 of the core board 11. The small board 17 is mounted on the core board 11 by using the solder 14 such that the surface electrode 19 at the end portion of the small board 17 corresponds to the surface electrode 13 around the cavity 16 of the core board 11. With this configuration, the electronic component 20 mounted at the center portion of the small board 17 can be housed in the cavity 16 of the core board 11.

By adjusting the printing thickness of the solder 14, which becomes the connection member, to make a gap between the core board 11 and the small board 17 to be at least about 50 μm, for example, the inside of the cavity 16 can be filled with the resin when the resin layer 21 is formed, which is described later. The thickness of the solder 14 is adjusted by adjusting the thickness of a metal mask that is used during printing. Thus, the gap between the core board 11 and the small board 17 can be determined to be in a range from about 50 μm to about 100 μm, for example.

Figure 2C:
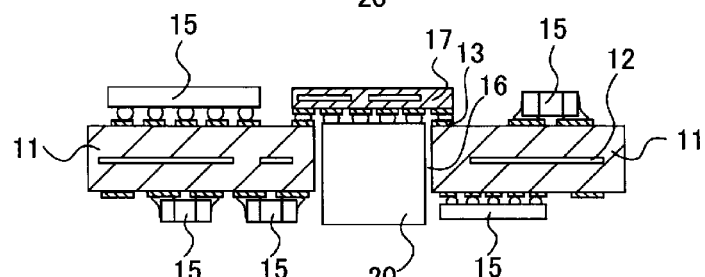

Then, as shown in FIG. 2C, the electronic component 15 is mounted on the second principal surface of the core board 11 by a method similar to that of the first principal surface.

Figure 2D:
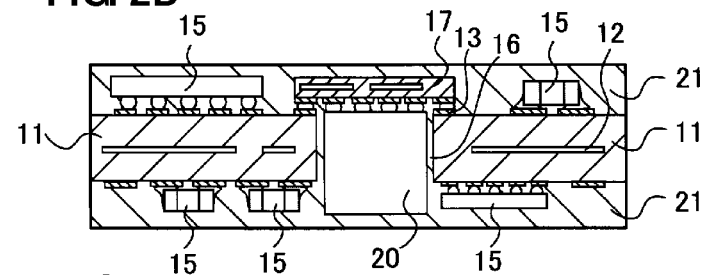

Then, as shown in FIG. 2D, the resin layers 21 are formed on both the principal surfaces of the core board 11. First, a resin sheet is stacked on the first principal surface of the core board 11, on which the electronic component 15 and the small board 17 are mounted. The resin sheet is formed by molding complex resin on a PET film and is semi-hardened. The state of the resin sheet is a so-called B-stage state or a prepreg state. The complex resin is made by mixing thermosetting resin and an inorganic filler. The thermosetting resin is, for example, epoxy resin, phenol resin, or cyanate resin. The inorganic filler is, for example, $Al_2O_3$, $SiO_2$, or $TiO_2$.

The gap is formed between the core board 11 and the small board 17 as described above. The resin of the stacked resin sheet flows into the cavity 16 through the gap, and hence the inside of the cavity 16 is filled with the resin. After the resin sheet is stacked, thermosetting processing is performed. Hence, the resin layer 21 is formed on the first principal surface.

Then, the resin sheet is similarly stacked on the second principal surface, and the resin layer 21 is formed by thermosetting. Thus, the resin layers 21 are formed on both the surfaces of the core board 11. Alternatively, the resin layers 21 on both the principal surfaces may be simultaneously formed by stacking the resin sheets on both the principle surfaces of the core board 11 and hardening the resin sheets by thermosetting.

Figure 2E:
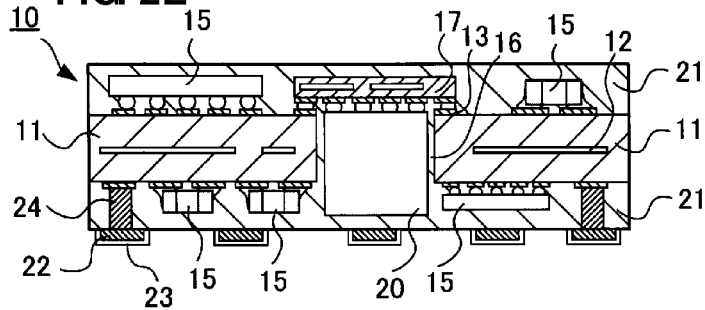

Then, as shown in FIG. 2E, the via 24, the outer electrode 22, and the plating film 23 are formed. Thus, the module board 10 according to the first preferred embodiment of the present invention is formed.

More specifically, the via 24 is preferably formed by forming a through hole in the resin layer 21 with a laser, desmearing the through hole with a chemical solution, then filling the through hole with conductive paste, and hardening the conductive paste. The conductive paste is preferably made by mixing metal particles and thermosetting resin. The metal particles are, for example, Au, Ag, Cu, Ni, Sn, or Bi. The thermosetting resin is, for example, epoxy resin, phenol resin, or cyanate resin.

The outer electrode 22 is formed by bonding a copper foil on the upper surface of the formed via 24, printing an etching resist, and etching.

Further, the plating film 23 is formed on the surface of the outer electrode 22. The plating film 23 is a Ni/Sn plating film or a Ni/Au plating film formed by wet plating. The module board 10 is completed by the above-described manufacturing method.

With the module board 10 according the first preferred embodiment, the electronic component 20 is mounted on the small board 17, on which even an electronic component including multiple terminals with small pitches between the terminals can be mounted, and the electronic component 20 is housed in the cavity 16 of the core board 11. Hence, the electronic component including the multiple terminals with the small pitches between the terminals can be housed in the cavity 16. Also, since the inside of the cavity 16 is filled with the resin, the electronic component 20 housed in the cavity 16 is sealed with the resin. Hence, the reliability of the electronic component 20 is significantly increased.

Figure 3A:
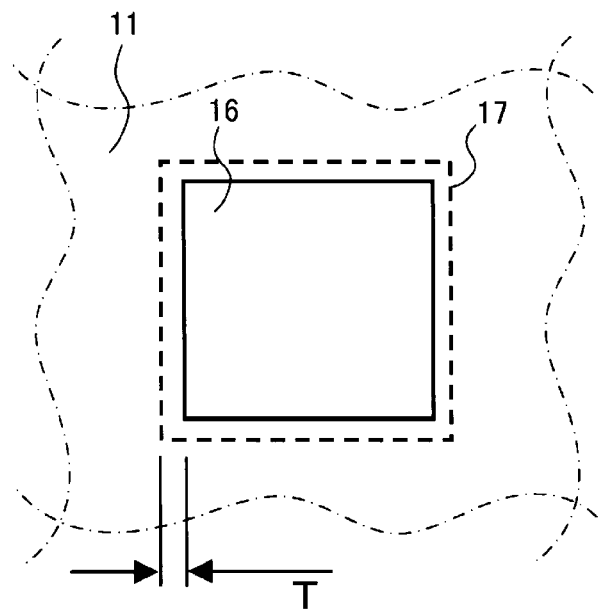
FIGS. 3A and 3B are schematic diagrams of a cavity portion of a core board of the module board according to the first preferred embodiment of the present invention, and a cavity portion of a core board of a module board according to a modification of a preferred embodiment of the present invention, in a view in the vertical direction.
Figure 3B:
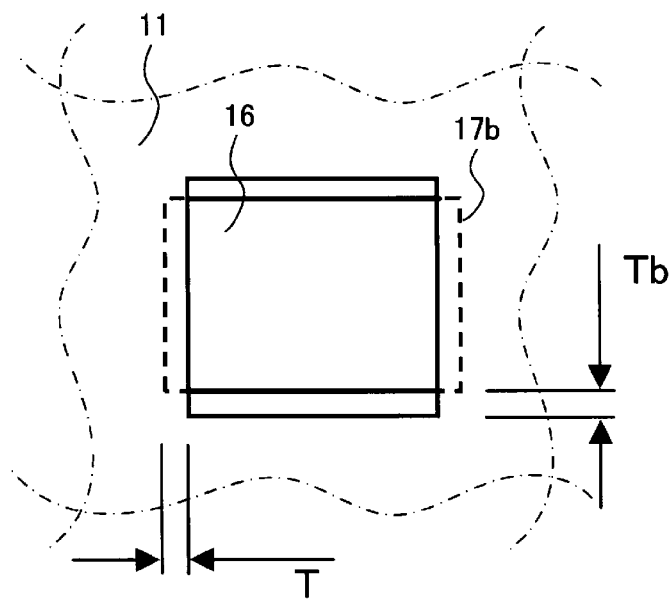

FIGS. 3A and 3B are schematic diagrams when the portion of the cavity 16 in the core board 11 is viewed in the vertical direction, and show the positions of the cavity 16 and the small board 17. In FIG. 3A, the small board 17 is larger than the cavity 16, and is connected to the core board 11 by the surface electrode arranged along the four sides of the small board 17. An overlap portion between the small board 17 and the core board 11 preferably has a dimension T in a range from about 50 μm to about 400 μm, for example. Accordingly, the resin easily flows into the cavity 16.

FIG. 3B is a modification of the first preferred embodiment of the present invention. A small board 17b overlaps the core board 11 at two sides by a dimension T, and the small board 17b has a gap with respect to the core board at the other two sides by a dimension Tb. Since the gap is present, the resin more easily flows into the cavity 16.

Second Preferred Embodiment

Figure 4:
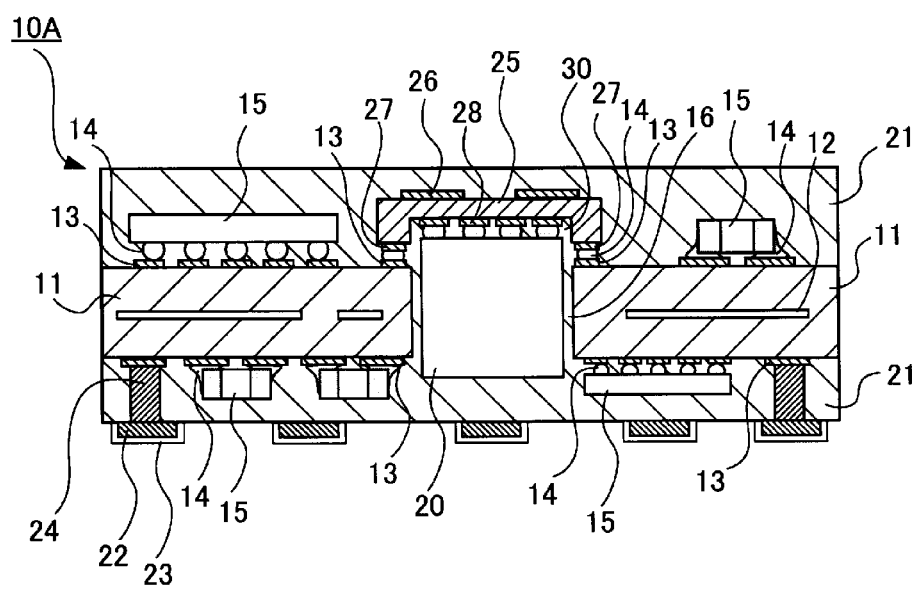
FIG. 4 is a cross-sectional view showing a module board according to a second preferred embodiment of the present invention.

FIG. 4 is a cross-sectional view of a module board 10A according to a second preferred embodiment of the present invention. The same reference signs are applied to portions corresponding to those in the first preferred embodiment and the redundant description is omitted. The second preferred embodiment differs from the first preferred embodiment in that a small board 25 on which the electronic component 20 is mounted includes a cavity 30 at a first principal surface.

The cavity 30 is provided at a center portion of the first principal surface of the small board 25. An end surface electrode 27 is arranged around the cavity 30. A bottom surface electrode 28 is located at the bottom surface of the cavity 30. The electronic component 20 is mounted on the bottom surface electrode 28 through the solder 14. A surface electrode 26 is located on a second principal surface of the small board 25.

Figure 5A:
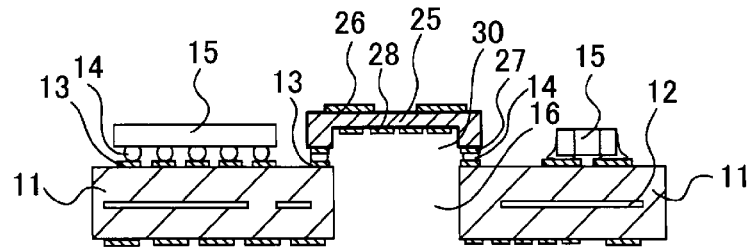
FIG. 5A-5D are cross-sectional views each showing a manufacturing step of the module board according to the second preferred embodiment of the present invention.

A manufacturing method of the module board according to the second preferred embodiment is described next with reference to FIGS. 5A-5D. As shown in FIG. 5A, the core board 11 including the cavity 16, and the small board 25 including the cavity 30 are prepared. The small board 25 preferably is an LTCC board including ceramic green sheets stacked on each other. A stack with a hollowed-out hole formed by punching during stacking and a stack without a hollowed-out hole are press-bonded. Thus, the portion of the hollowed-out hole can be provided as the cavity 30.

The electronic component 15 is mounted on the surface electrode 13 on the first principal surface of the core board 11, and the small board 25 is mounted on the surface electrode 13 around the cavity 16. The bottom surface of the cavity 30 of the small board 25 is exposed through the cavity 16 from the second principal surface side of the core board 11.

Figure 5B:
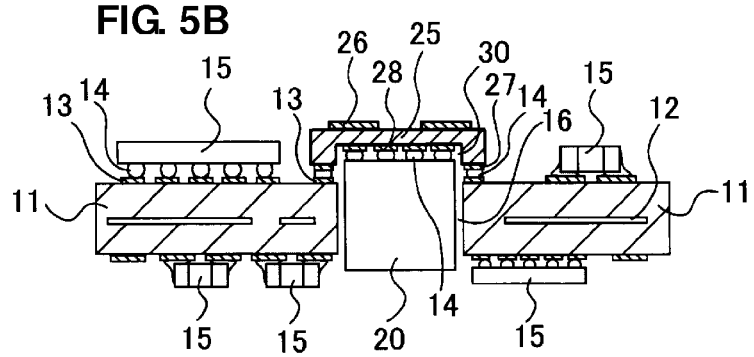

Then, as shown in FIG. 5B, the solder 14 is supplied and applied by a dispenser onto the bottom surface electrode 28 of the small board 25 from a side at the second principal surface of the core board 11. Then, the electronic component 20 is mounted. The electronic component 20 is housed in the cavity 16 and the cavity 30. Further, the electronic component 15 is mounted on the second principal surface of the core board 11.

Figure 5C:
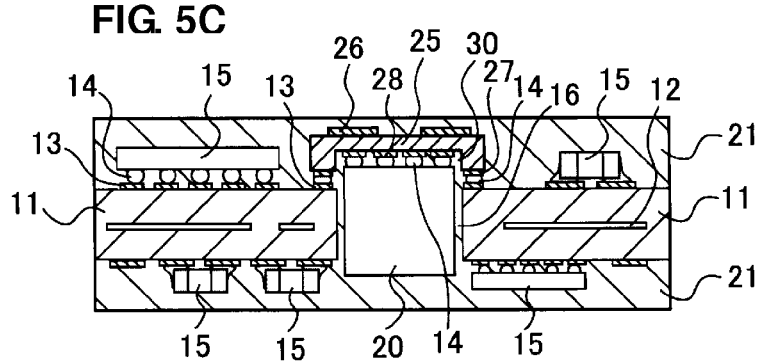
Figure 5D:
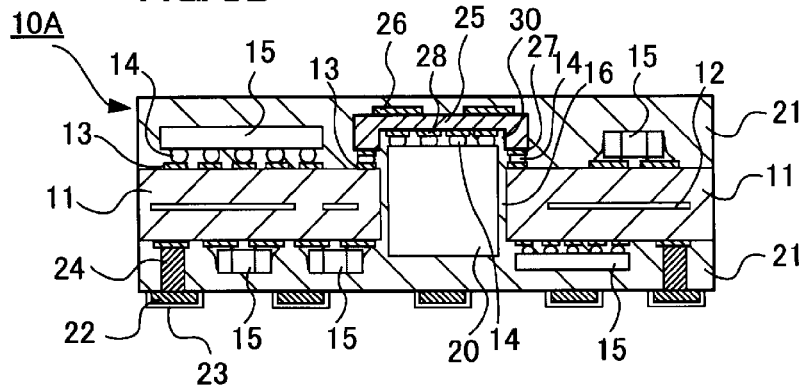

Then, as shown in FIG. 5C, the resin layers 21 are formed on both the principal surfaces of the core board 11. Since the gap is formed between the core board 11 and the small board 25, the resin flows into the cavity 16 and the cavity 30. Thus, the cavities 16 and 30 are filled with the resin. Then, as shown in FIG. 5D, the via 24, the outer electrode 22, and the plating film 23 are formed. Thus, the module board 10A is completed.

With the module board 10A according to the second preferred embodiment, since the small board 25 includes the cavity 30, the electronic component 20 can be housed in the cavity 16 of the core board and the cavity 30 of the small board 25. Accordingly, the height of the module board can be decreased.

Also, in the manufacturing method according to the second preferred embodiment, the small board 25 is mounted on the first principal surface of the core board 11, and then the electronic component 20 is mounted on the first principal surface of the small board 25 from the side at the second principal surface of the core board 11. With this manufacturing method, even if the small board 25 does not have a cavity, of course, the method can be performed.

Third Preferred Embodiment

Figure 6:
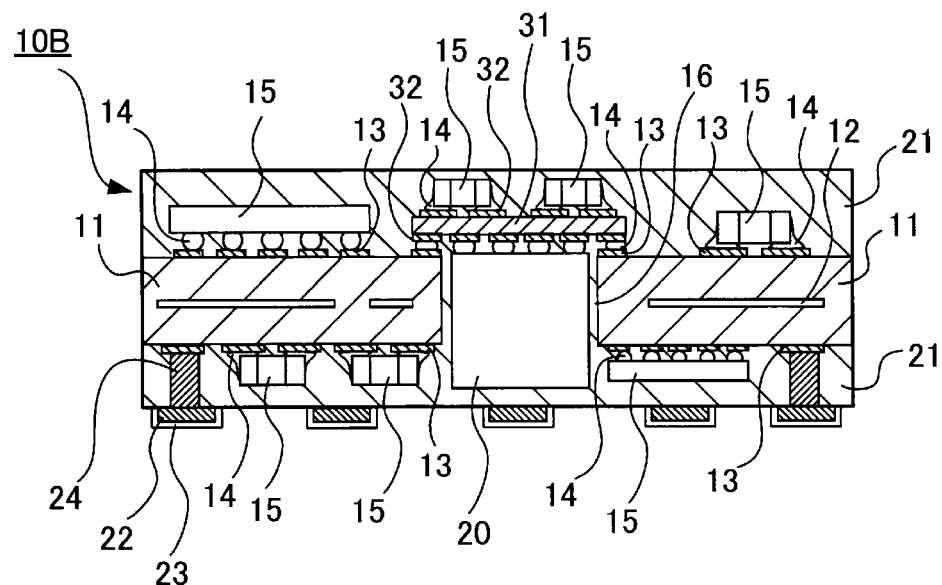
FIG. 6 is a cross-sectional view showing a module board according to a third preferred embodiment of the present invention.

FIG. 6 is a cross-sectional view of a module board 10B according to a third preferred embodiment of the present invention. The same reference signs are applied to portions corresponding to those in the first preferred embodiment and the redundant description is omitted. The third preferred embodiment differs from the first preferred embodiment in that the electronic component 20 is mounted on a surface electrode 32 on a first principal surface of a small board 31 through the solder 14, and the electronic component 15 is mounted on a surface electrode 32 on a second principal surface of the small board 31 through the solder 14.

As described above, in the module board 10B according to the third preferred embodiment, the electronic components can be mounted on both the principal surfaces of the small board 31. Hence, the number of components embedded in a module board can be increased. Accordingly, the packaging density can be increased, and the module board can be downsized.

Fourth Preferred Embodiment

Figure 7:
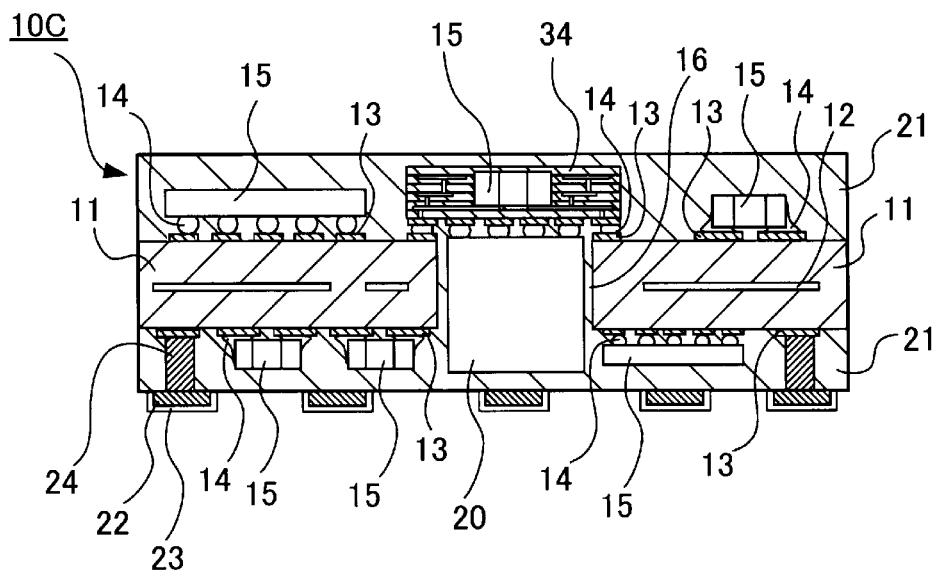
FIG. 7 is a cross-sectional view showing a module board according to a fourth preferred embodiment of the present invention.

FIG. 7 is a cross-sectional view of a module board 10C according to a fourth preferred embodiment of the present invention. The same reference signs are applied to portions corresponding to those in the first preferred embodiment and the redundant description is omitted. The fourth preferred embodiment differs from the first preferred embodiment in that the electronic component 20 is mounted on a first principal surface of a small board 34, and the electronic component 15 is embedded in the small board 34. The small board 34 includes a plurality of layers, and includes inner wiring therein. The electronic component 15 is connected to the inner wiring.

As described above, with the module board 10C according to the fourth preferred embodiment, the electronic component can be mounted on the first principal surface of the small board 34, and the electronic component can be embedded in the small board 34. Accordingly, the number of components that can be embedded in a module board can be increased. As the result, the packaging density of the module board can be increased, the height of the module board can be decreased, and the module board can be further downsized.

Figure 8:
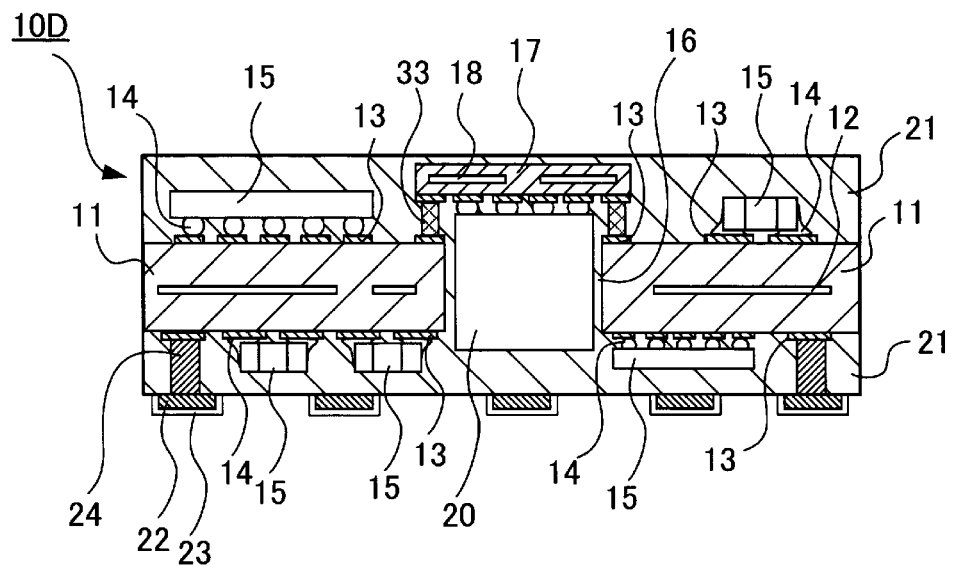
FIG. 8 is a cross-sectional view showing a modification of the module board according to a preferred embodiment of the present invention.

Modifications of the preferred embodiments of the present invention are described with reference to FIGS. 8 and 9. In a module board 10D shown in FIG. 8, the small board 17 is mounted on the core board 11 by a post 33 preferably formed by an inkjet method. The gap between the small board 17 and the core board 11 can be further increased. Hence, fluidity of the resin into the cavity 16 can be further increased.

Figure 9:
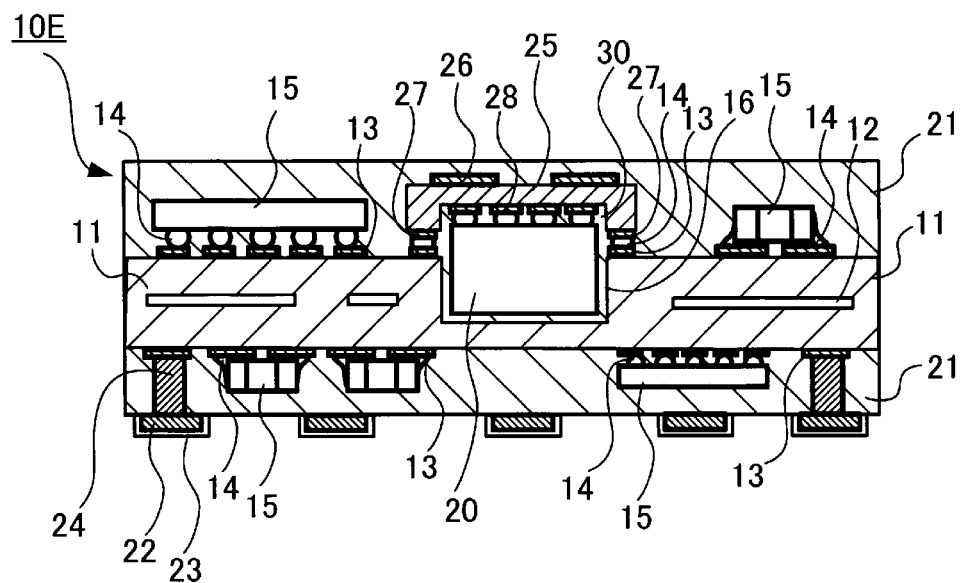
FIG. 9 is a cross-sectional view showing a modification of the module board according to a preferred embodiment of the present invention.

In a module board 10E shown in FIG. 9, the cavity 16 of the core board 11 is a non-through hole. Even in this case, the advantages of the present invention of filling the cavity 16 with the resin can be attained. As described above, the cavity 16 of the core board 11 may be a non-through hole or a through hole depending on the size of the electronic component 20.

In each of the above-described preferred embodiments, the example of the core board has been the LTCC board. However, the core board may be a resin board, such as a rigid board or a flexible board, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module board, comprising:
a first board including an electronic component mounted on a first principal surface, the first board having a rectangular or substantially rectangular shape including first and second opposed sides, and third and fourth opposed sides extending in a direction perpendicular or substantially perpendicular to the first and second opposed sides; and
a second board including a hole arranged to house the electronic component; wherein
the first board is mounted on a first principal surface of the second board such that the electronic component is housed in the hole;
the first and second opposed sides of the first board overlap portions of the second board when viewed in a direction perpendicular to the first principal surface of the first board;
the third and fourth opposed sides of the first board overlap the hole so as to spaced away from the second board by a gap when viewed in the direction perpendicular to the first principal surface of the first board;
resin layers are located on both the first principal surface and a second principal surface of the second board, and an inside of the hole is filled with resin;
the resin layers are located on a second principal surface of the first board opposite to the first principal surface of the first board, on the first and second opposed sides of the first board, and on the third and fourth opposed sides of the first board; and
the first and second boards are made of a different material than a material from which the resin layers are made.

2. The module board according to claim 1, wherein the electronic component housed in the hole protrudes from the second principal surface of the second board.

3. The module board according to claim 1, wherein the first board includes a recess at the first principal surface of the first board, and the electronic component is mounted in the recess.

4. The module board according to claim 2, wherein the first board includes a recess at the first principal surface of the first board, and the electronic component is mounted in the recess.

5. The module board according to claim 1, wherein another electronic component is mounted on the second principal surface of the first board.

6. The module board according to claim 2, wherein another electronic component is mounted on the second principal surface of the first board.

7. The module board according to claim 3, wherein another electronic component is mounted on the second principal surface of the first board.

8. The module board according to claim 4, wherein another electronic component is mounted on the second principal surface of the first board.

9. The module board according to claim 1, wherein another electronic component is embedded in the first board.

10. The module board according to claim 2, wherein another electronic component is embedded in the first board.

11. The module board according to claim 3, wherein another electronic component is embedded in the first board.

12. The module board according to claim 4, wherein another electronic component is embedded in the first board.

13. The module board according to claim 5, wherein another electronic component is embedded in the first board.

14. The module board according to claim 6, wherein another electronic component is embedded in the first board.

15. The module board according to claim 7, wherein another electronic component is embedded in the first board.

16. The module board according to claim 8, wherein another electronic component is embedded in the first board.

17. The module board according to claim 1, wherein the hole is covered with the first board.

18. The module board according to claim 2, wherein the hole is covered with the first board.

19. The module board according to claim 1, wherein the resin layer that is located on the first principal surface of the second board completely covers the second principal surface of the first board opposite to the first principal surface of the first board such that the first board is embedded in the resin layer located on the first principal surface of the second board.

\* \* \* \* \*